United States Patent [19]

Rosen

[11] 4,381,952
[45] May 3, 1983

[54] METHOD FOR FABRICATING A LOW LOSS VARACTOR DIODE

[75] Inventor: Arye Rosen, Cherry Hill, N.J.

[73] Assignee: RCA Corporation, New York, N.Y.

[21] Appl. No.: 262,621

[22] Filed: May 11, 1981

[51] Int. Cl.$^3$ .................. H01L 21/263; H01L 21/203; H01L 21/22

[52] U.S. Cl. .................................. 148/1.5; 29/576 B; 29/576 E; 148/187; 357/14; 357/91

[58] Field of Search .................... 148/1.5, 187; 357/14, 357/91; 29/576 B, 576 E

[56] References Cited

U.S. PATENT DOCUMENTS

| | | | |
|---|---|---|---|
| 3,523,838 | 8/1970 | Heidenreich | 148/175 |
| 3,634,738 | 1/1972 | Leith | 148/1.5 |
| 3,638,300 | 2/1972 | Foxhall | 148/1.5 |
| 3,840,306 | 10/1974 | Raabe | 357/14 |
| 3,878,001 | 4/1975 | Olk | 357/14 |
| 4,038,106 | 7/1977 | Kawamoto | 148/1.5 |
| 4,106,953 | 8/1978 | Onodera | 148/1.5 |
| 4,226,648 | 10/1980 | Goodwin et al. | 357/14 |
| 4,230,505 | 10/1980 | Wu et al. | 148/1.5 |
| 4,250,514 | 2/1981 | Raabe | 357/14 |

OTHER PUBLICATIONS

Large-Area Varactor Diode For Electrically Tunable, High-Power UHF Bandpass Filter, G. A. Swartz et al., IEEE Transactions on Electron Devices, vol. ED-27, No. 11, Nov. 1980, pp. 2146-2151.

*Primary Examiner*—Upendra Roy
*Attorney, Agent, or Firm*—Birgit E. Morris; Donald S. Cohen; Kenneth R. Glick

[57] ABSTRACT

A low conductivity, first conductivity type epitaxial layer is formed on a substrate of high conductivity, first conductivity type semiconductor material. Conductivity modifiers of second conductivity type are then implanted into the epitaxial layer so as to create a PN junction in the epitaxial layer. The substrate is next thinned, and conductivity modifiers of first conductivity type are implanted into the thinned surface so as to form a very high conductivity layer at the thinned surface.

10 Claims, 7 Drawing Figures

METHOD FOR FABRICATING A LOW LOSS VARACTOR DIODE

BACKGROUND OF THE INVENTION

The present invention relates to a method for fabricating a varactor diode on a semiconductor substrate. More particularly, the invention relates to a method for fabricating high Q, high voltage varactor diodes in a readily reproducible manner.

A conventional varactor diode incorporates an active semiconductor layer which is sandwiched between a pair of contact layers. The two contact layers are of high conductivity and are of opposite conductivity type from each other, such that one of the contact layers forms a PN junction with the active layer. The thickness of the active layer, as well as the relative conductivity between the active layer and each of the contact layers, determines the operating characteristics of the varactor.

Varactor diodes are frequently fabricated by initially providing a silicon substrate having a resistivity which matches that of the desired active layer. The heavily doped contact layers are then epitaxially formed and conductor material is deposited on the contact layers. Alternatively, the diode can be formed by starting with a high conductivity substrate and then sequentially forming an epitaxial active layer and epitaxial contact layer.

However, both of these conventional fabrication techniques present significant practical problems. The formation of heavily doped epitaxial films creates dopant atom contamination in the deposition chamber which is used, necessitating stringent cleaning procedures between deposition runs and additional maintenance. Any residues which remain in the chamber during deposition make the dopant concentration in the epitaxial film difficult to control, thereby reducing yield. Furthermore, the growth of a relatively low conductivity active layer on a heavily doped contact layer generates a significant number of crystalline defects in the active layer.

In an effort to overcome some of these manufacturing difficulties, the use of a buffer layer between the high conductivity contact layer and active layer has been suggested. For example, in LARGE-AREA VARACTOR DIODE FOR ELECTRICALLY TUNABLE HIGH POWER UHF BANDPASS FILTER, by G. A. Swartz et al, IEEE Trans., Vol. ED-27, No. 11, November 1980, varactor diodes are reported to be fabricated by epitaxially forming N+, N, and P+ layers on an N++ silicon substrate. The N+ layer in this structure serves to minimize the number of defects introduced by the N++ silicon substrate into the N active layer. However, this suggested fabrication technique does not completely rectify the aforementioned contamination problems. Deposition chamber contamination still occurs during the formation of heavily doped epitaxial layers, limiting control over the impurity profile in the active layer.

In an effort to eliminate these remaining problems, the present method for fabricating diodes has been developed. In the following description the conductivity of particular semiconductor regions will be referred to as very high, high, or low. Very high conductivity regions, designated N++ or P++, have carrier concentrations greater than approximately $10^{19}$ cm$^{-3}$; high conductivity regions, designated N+ or P+, have approximately $10^{18}$ cm$^{-3}$; and low conductivity regions, designated N or P, have approximately $10^{15}$ to $10^{17}$ cm$^{-3}$.

SUMMARY OF THE INVENTION

A low conductivity first conductivity type semiconductor layer is epitaxially formed on a high conductivity first conductivity type semiconductor substrate. Conductivity modifiers of second conductivity type are then implanted into the epitaxial layer so as to form a PN junction in the epitaxial layer. The substrate is then thinned to a desired thickness and conductivity modifiers of first conductivity type are implanted into the thin surface so as to form a very high conductivity layer at that surface.

DETAILED DESCRIPTION

Figure 1:
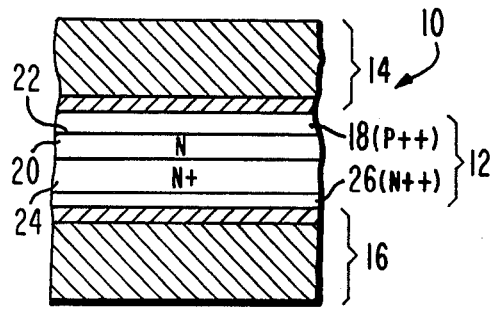
FIG. 1 illustrates a preferred embodiment of a varactor diode fabricated in accordance with the present invention.

A sectional view of a varactor diode fabricated in accordance with the present invention is illustrated at 10 in FIG. 1. The diode 10 is composed of a semiconductor body 12 having first and second electrodes 14 and 16 disposed on opposing surfaces thereof. The semiconductor body 12 is comprised of a sequence of layers wherein each layer is of a particular conductivity type and has a particular carrier concentration through its thickness. In the preferred embodiment, a first contact layer 18 of P++ type material is adjacent to the first electrode 14 and an N type active layer 20 is adjacent to the contact layer 18 so as to form a PN junction 22 therebetween. An N+ buffer layer is disposed on the active layer 20, and an N++ type contact layer 26 is disposed across the buffer layer 24. The second electrode 16 is disposed on the second contact layer 26. It is important to recognize that although the various layers within the semiconductor body 12 have been identified as being of a particular conductivity type, an equivalent device would result if the conductivity type of each layer were reversed. All N type regions could be P type and the P type region could be N type.

Figure 2:
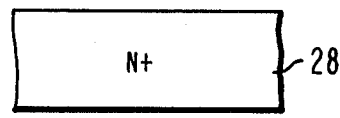

The starting point for the fabrication sequence of the present invention is illustrated in FIG. 2. A high conductivity substrate 28, designated as being of N+ type conductivity, is provided. The material of the semiconductor substrate 28 will ultimately become the buffer layer 24, so it should have a conductivity within the previously indicated high conductivity range. It should be noted that there exists some flexibility in the conductivity of this starting material since it will ultimately serve as merely a transition layer between the active layer 20 and the contact layer 26. In the preferred embodiment the substrate 28 is monocrystalline silicon, although other semiconductor materials, such as GaAs, would be suitable as well.

Figure 3:
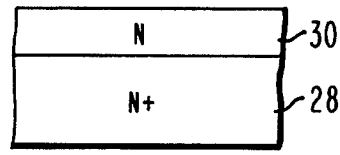

An epitaxial layer 30 is then formed on the substrate 28, as illustrated in FIG. 3. A portion of the epitaxial layer 30 will ultimately become the device active layer 20, so both the thickness and particular conductivity of the layer 30 should be adjusted accordingly. In the preferred embodiment the epitaxial layer 30 is approximately 6 microns thick and is doped with arsenic to yield a carrier concentration of approximately $3 \times 10^{15}$ cm$^{-3}$.

Figure 4:
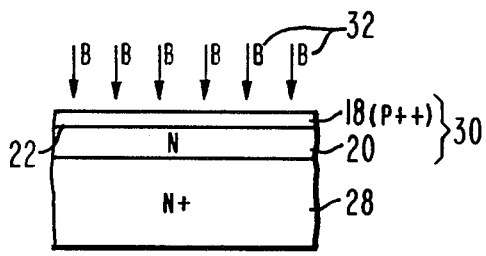
Figure 5:
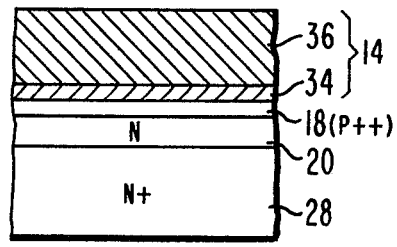

As illustrated in FIG. 4, a P type dopant is next ion implanted into the epitaxial layer 30, as indicated by the arrows 32. The implantation dose and energy level are adjusted so as to create a very high conductivity P++ layer 18 at the surface of the epitaxial layer 30, thereby defining the thickness of, and forming a PN junction 22 with, the active layer 20. In the preferred embodiment, boron is implanted at an energy level of 40-50 KeV and a dose of $1.5 \times 10^{15}$ cm$^{-2}$ so as to create an approximately 0.5 micron thick P++ contact layer 18 having a carrier concentration of approximately $5 \times 10^{19}$ cm$^{-3}$.

Following the implantation step, the P++ layer 18 is annealed so as to remove crystallographic damage. This can be accomplished thermally by heating the substrate to approximately 1000° C., for 20 minutes, or it can be accomplished by laser annealing. The first electrode 14 is then deposited on the contact layer 18. The first electrode 14 can be of any material which forms an ohmic contact with the contact layer 18, and in the preferred embodiment it is fabricated in two steps. In the first step, an evaporated layer 34 is formed by sequentially evaporating chromium, platinum, and gold to a total thickness of approximately 2500 Angstroms. In the second step, a copper heat sink 36 is electroplated onto the evaporated layer 34. The copper heat sink 36 is relatively thick, being approximately 50-75 microns, and it can serve as a handle during subsequent processing steps.

Figure 6:
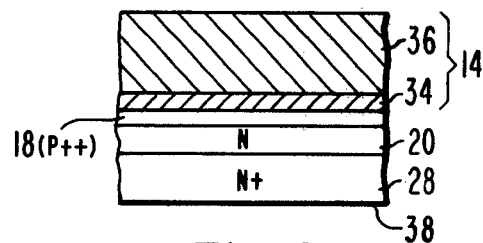
FIGS. 2-7 illustrate the processing sequence of the present invention.

The substrate 28 is then thinned to its final dimension as illustrated in FIG. 6. This can be performed, for example, by chemically etching, and will create a thinned substrate surface 38. The chemical etching can be performed in a solution of 92% HNO$_3$ and 8% HF. In the preferred embodiment, the final thickness of the substrate 28 is approximately 10 microns, although any desired thickness greater than zero may be used, depending on the particular diode characteristics desired.

Figure 7:
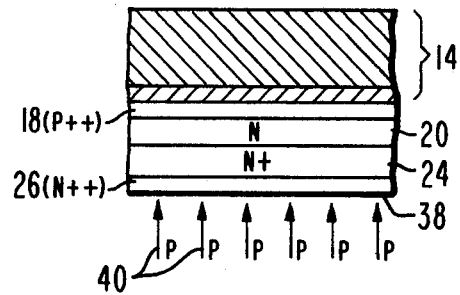

Identified at 40 in FIG. 7, an implantation of an N type impurity, such as phosphorus, is then performed into the thinned surface 38. This implantation serves to form the very high conductivity N++ second contact layer 26 and to define the final thickness of the N+ buffer layer 24. The carrier concentration in the second contact layer 26 should be approximately $5 \times 10^{19}$ cm$^{-3}$ and it should have a thickness of approximately 0.5 microns. Typical implantation parameters are 40-50 KeV and a dose of $1.5 \times 10^{15}$ cm$^{-2}$.

The structure is then again annealed, so as to remove crystal damage induced by this second implantation. However, the annealing following the second implantation should be performed by laser rather than by thermal heating, so as to prevent degradation of the first electrode 14 or the first electrode/first contact layer interface. The second electrode 16 is then ohmically formed on the surface 38 of the second contact layer 26. Again, the electrode can be fabricated by first evaporating a chromium/platinum/gold layer and then electroplating a copper heat sink. This will produce the final varactor diode structure as illustrated in FIG. 1.

The described diode fabrication sequence can be readily implemented in a production line environment. Since the heavily doped contact layers of the present structure are not formed by epitaxial means, deposition chamber contamination does not occur. Yet, the diode presents all the advantages which occur due to the P++/N/N+/N++ structure as described in the G. A. Swartz et al article.

Varactor diodes having high Q and high voltage capability can be readily fabricated in accordance with the present invention. The preferred embodiment of the processing sequence, described herein, has produced diodes having a breakdown voltage of 100 V, a capacitance of 500 pF, and a Q greater than 200 at −8 V bias. Diodes of lower capacitance, on the order of 60-100 pF, yielded Q values on the order of 600.

The present invention permits manipulation of Q value because it allows adjustment of the thickness of the buffer layer and both contact layers. Buffer layer thickness can be controlled during the substrate thinning step, and contact layer thickness is controlled during the ion implantation steps. The diode voltage capability is determined by the thickness and conductivity profile of the active layer. In the described process these parameters are controlled during the epitaxial growth of the active layer.

I claim:

1. A method for fabricating a low loss varactor diode, comprising the steps of:
   providing a high conductivity first conductivity type semiconductor substrate;
   epitaxially forming a low conductivity first conductivity type semiconductor layer on said substrate;
   implanting conductivity modifiers of second conductivity type into said epitaxial layer so as to form a very high conductivity layer at the surface thereof, said implanted layer forming a PN junction with said epitaxial layer;
   thinning the substrate so as to form a thinned surface; and
   implanting conductivity modifiers of first conductivity type into the thinned surface so as to form a very high conductivity layer at said surface.

2. A method in accordance with claim 1, further comprising:
   annealing the structure following the implantation steps.

3. A method in accordance with claim 2, wherein the annealing following the second implantation is performed by laser irradiation.

4. A method in accordance with claim 1, further comprising:
   forming a first electrode on the epitaxial layer following the first implantation step.

5. A method in accordance with claim 1, further comprising:
   forming an electrode on said thinned surface following the second implantation step.

6. A method in accordance with claims 4 or 5, wherein the electrode is formed by the steps of:
   sequentially evaporating chromium, platinum, and gold; and
   electroplating a relatively thick copper layer.

7. A method in accordance with claim 1, wherein the substrate is thinned by:
   etching the substrate in a mixture of 92% HNO$_3$ and 8% HF.

8. A method in accordance with claim 1, further comprising:
   forming the epitaxial layer with a carrier concentration of approximately $3 \times 10^{15}$ cm$^{-3}$ and a thickness of approximately 6 microns.

9. A method in accordance with claim 8, further comprising:
   implanting at an energy level of 40-50 KeV and a dose of $1.5 \times 10^{15}$ cm$^{-2}$.

10. A method in accordance with claim 8, further comprising:
    thinning the substrate to a thickness of approximately 10 microns.

* * * * *